Jan. 21, 1969 D. RUSHTON 3,423,721

CONNECTORS FOR USE WITH FLEXIBLE PRINTED CIRCUITS

Filed Nov. 8, 1966

United States Patent Office 3,423,721
Patented Jan. 21, 1969

3,423,721
CONNECTORS FOR USE WITH FLEXIBLE PRINTED CIRCUITS

Derek Rushton, Accrington, England, assignor to Joseph Lucas (Industries) Limited, London, England Filed Nov. 8, 1966, Ser. No. 592,897
Claims priority, application Great Britain, Jan. 4, 1966, 238/66
U.S. Cl. 339—174 3 Claims
Int. Cl. H01r *13/50;* H05k *1/04*

This invention relates to connectors for use with flexible printed circuits.

A connector according to the invention comprises a pair of interengageable parts between which the flexible printed circuit is sandwiched in use, at least one socket in one of the parts, and a resilient electrical contact carried by the other part and adapted to enter said socket when the parts are interengaged, the arrangement being such that a connection to a conductor in the flexible printed circuit can be made by exposing part of the conductor at a position corresponding with said socket and then interengaging the parts.

Figure 1:
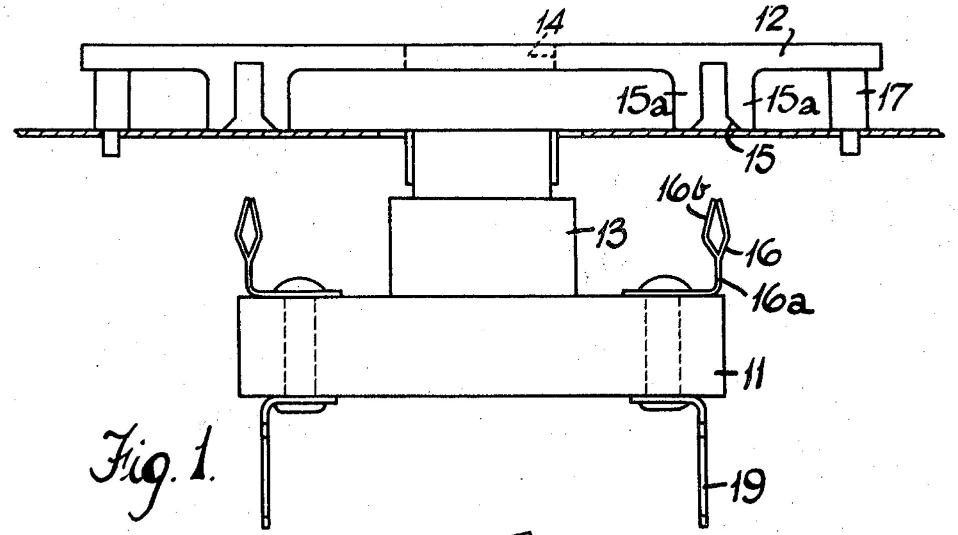
Figure 3:
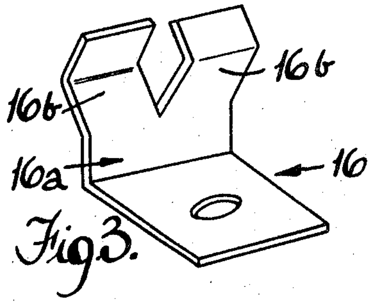
Figure 2:
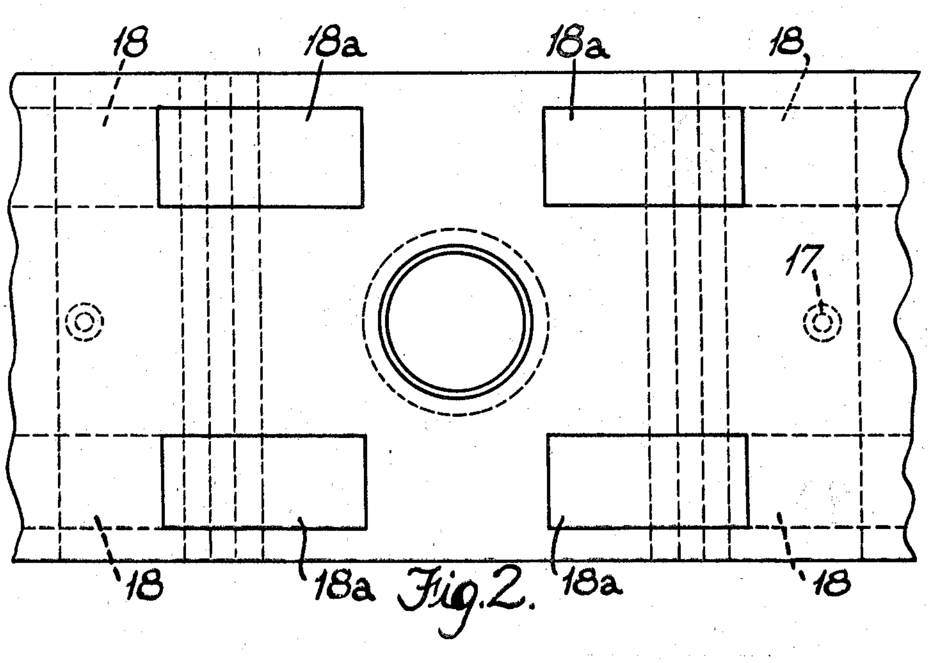

One example of the invention is illustrated in the accompanying drawings wherein, FIGURE 1 is an exploded side elevational view of a connector; FIGURE 2 is a plan view of the flexible printed circuit shown in FIGURE 1 and FIGURE 3 is a perspective view of one of the contacts shown in FIGURE 1.

Referring to the drawings, it is desired to make four connections to a flexible printed circuit, which comprises a plurality of flexible strip-like conductors between two layers of flexible insulating material, and for this purpose a pair of interengageable parts 11, 12 are provided, the part 11 having an upstanding spigot 13 which engages a hole 14 in the part 12. The part 12 is shaped to define four sockets 15 at its corners, the sockets conveniently being defined by two pairs of parallel ribs 15*a* integral with part 12. When the parts 11, 12 are interengaged the sockets 15 are engaged respectively by four resilient contacts 16, each of which comprises a base 16*a* having extending therefrom a pair of offset arms 16*b* (FIGURE 3). The part 12 further incorporates at its end a pair of central posts 17. The flexible circuit is located on the part 12 by engaging holes provided in the flexible printed circuit with the posts 17. In this position, one end 18*a* of each of four conductors 18 of the flexible printed circuit extends over the sockets 15 respectively. The ends of the conductors are exposed by removing the insulating layers from both sides thereof, the ends 18 thus defining four conductive flaps.

On engagement of parts, the ends 18 are folded into the sockets 15 by the contacts 16, which make the required electrical connections thereto. As indicated, the contacts 16 are connected to terminal strips 19.

What I claim is:

1. A connector for use with a flexible printed circuit comprising a pair of parts between which the flexible printed circuit having a conductor is sandwiched in use, a projection on one of said parts, a complementary recess in the other of said parts, location means on one of said parts for said flexible printed circuit, at least one socket in one of the parts, and at least one resilient electrical contact carried by the other part and entering said socket when said projection is engaged in said complementary recess, the arrangement being such that a connection to the conductor in the flexible printed circuit can be made by locating the flexible printed circuit on said location means with part of the conductor exposed at a position corresponding with said socket and then interengaging said projection with said complementary recess and said electrical contact with said socket.

2. A connector as claimed in claim 1 wherein said one part is formed with at least one pair of parallel ribs, the ribs defining between them the sockets for reception of the resilient contacts carried by said other part.

3. A connector as claimed in claim 1 wherein each resilient contact includes a pair of arms which are offset from the base of the contact in opposite directions.

References Cited

UNITED STATES PATENTS

| | | | |
|---|---|---|---|
| 3,011,143 | 11/1961 | Dean | 339—217 X |
| 3,070,771 | 12/1962 | Piorunneck | 339—174 |
| 3,102,767 | 9/1963 | Schneck | 339—17 X |
| 3,158,421 | 11/1964 | Hasenauer | 339—176 |

MARVIN A. CHAMPION, *Primary Examiner.*

J. R. MOSES, *Assistant Examiner.*

U.S. Cl. X.R.

339—17